United States Patent
Winter et al.

(10) Patent No.: US 9,159,378 B2
(45) Date of Patent: Oct. 13, 2015

(54) PERFORMANCE MONITOR WITH MEMORY RING OSCILLATOR

(75) Inventors: Mark Winter, Seattle, WA (US); Eric Hall, Bellevue, WA (US)

(73) Assignee: BROADCOM CORPORATION, Irvine, CA (US)

( * ) Notice: Subject to any disclaimer, the term of this patent is extended or adjusted under 35 U.S.C. 154(b) by 643 days.

(21) Appl. No.: 12/930,470

(22) Filed: Jan. 6, 2011

(65) Prior Publication Data

US 2012/0146672 A1 Jun. 14, 2012

Related U.S. Application Data

(60) Provisional application No. 61/459,534, filed on Dec. 13, 2010.

(51) Int. Cl.
| | |
|---|---|
| *G01R 31/3187* | (2006.01) |
| *G11C 5/14* | (2006.01) |
| *G11C 29/02* | (2006.01) |
| *G11C 29/06* | (2006.01) |
| *G01R 31/28* | (2006.01) |

(52) U.S. Cl.
CPC .............. *G11C 5/147* (2013.01); *G11C 29/021* (2013.01); *G11C 29/06* (2013.01); *G01R 31/2884* (2013.01)

(58) Field of Classification Search
CPC ............................................. H01L 2225/06596
USPC ........... 324/750.3, 327, 331, 537; 331/44, 57, 331/187; 327/146, 331
See application file for complete search history.

(56) References Cited

U.S. PATENT DOCUMENTS

| | | | | |
|---|---|---|---|---|
| 4,128,816 | A * | 12/1978 | Shimotsuma | 331/116 FE |
| 5,331,295 | A * | 7/1994 | Jelinek et al. | 331/57 |
| 5,650,754 | A * | 7/1997 | Joshi et al. | 331/36 C |
| 5,754,418 | A * | 5/1998 | Park et al. | 363/60 |
| 7,082,067 | B2 * | 7/2006 | Venkatraman et al. | 365/201 |
| 7,205,854 | B2 * | 4/2007 | Liu | 331/57 |
| 7,376,001 | B2 * | 5/2008 | Joshi et al. | 365/154 |
| 7,518,394 | B1 * | 4/2009 | Chirania et al. | 326/16 |
| 8,095,104 | B2 * | 1/2012 | Kawae et al. | 455/333 |
| 2006/0050600 | A1 * | 3/2006 | Venkatraman et al. | 365/233 |
| 2010/0164476 | A1 * | 7/2010 | Molchanov et al. | 324/76.82 |
| 2010/0244878 | A1 * | 9/2010 | Yamada et al. | 324/763 |

OTHER PUBLICATIONS

Dixon, Robert P., Using Ring Oscillators to Determine Memory Performance, IPCOM000006188D, Dec. 12, 2001, pp. 56-57.*
IPCOM000045106D, Schoenike, RL, "LSSD Testable Ring Oscillator", Feb. 6, 2005, pp. 1-3.*
IPCOM000117687D, Emeigh et al., "Range Enhancement for Ring Oscillator Delay Element", Mar. 31, 2005, pp. 41-43.*

* cited by examiner

*Primary Examiner* — Tung X Nguyen
*Assistant Examiner* — Giovanni Astacio-Oquendo
(74) *Attorney, Agent, or Firm* — Oblon, McClelland, Maier & Neustadt, L.L.P.

(57) ABSTRACT

Disclosed is a monitoring system that includes at least one performance monitor integrated into a semiconductor die. The performance monitor comprises at least one ring oscillator that includes a plurality of stages. Each stage comprises at least one memory device. In one embodiment, the performance monitor may also include a setting circuit that has a burn-in input and an enable input. The setting circuit is capable of setting an input signal of the at least one ring oscillator to a reference voltage level. The performance monitor is configured to produce a ring delay that is characterized by a performance of the at least one memory device. The ring delay may be utilized to scale an operating voltage of the at least one memory device on the semiconductor die.

20 Claims, 4 Drawing Sheets

PERFORMANCE MONITOR WITH MEMORY RING OSCILLATOR

The present application claims the benefit of and priority to a provisional patent application entitled "Performance Monitor With Memory Ring Oscillator," Ser. No. 61/459,534 filed on Dec. 13, 2010. The disclosure in that provisional application is hereby incorporated fully by reference into the present application.

BACKGROUND OF THE INVENTION

1. Field of the Invention

The present invention is generally in the field of electronic circuits and systems. More specifically, the present invention is in the field of semiconductor circuits and systems.

2. Background Art

Adaptive voltage scaling systems regulate the supply voltage of devices on a semiconductor die based on operating characteristics such as carrier mobility. In adaptive voltage scaling systems, a performance monitor typically measures operating characteristics like carrier mobility while a regulation module evaluates whether a given supply voltage should be increased or decreased. However, conventional performance monitors have proven inadequate to monitor the operating characteristics of a semiconductor die with a significant number of memory devices for at least several reasons.

For example, conventional performance monitors are often unable to accommodate or track the different operating parameters of memory devices and logic devices on the same die. In addition, conventional performance monitors have typically been unable to track the different operating parameters of P type devices and N type devices on the same die. As a result, conventional performance monitors often inaccurately represent the operating parameters of a semiconductor die with a significant number of memory cells, and may cause critical errors in an adaptive voltage scaling system as applied to such cells. For example, memory devices in such a system may operate sub-optimally or erroneously turn off due to inaccurately regulated supply voltages.

Accordingly, there is a need to overcome the drawbacks and deficiencies in the art by providing a performance monitor configured to support adaptive voltage scaling for memory cells.

SUMMARY OF THE INVENTION

The present application is directed to a performance monitor with a memory ring oscillator, substantially as shown in and/or described in connection with at least one of the figures, as set forth more completely in the claims.

DETAILED DESCRIPTION OF THE INVENTION

Figure 1:
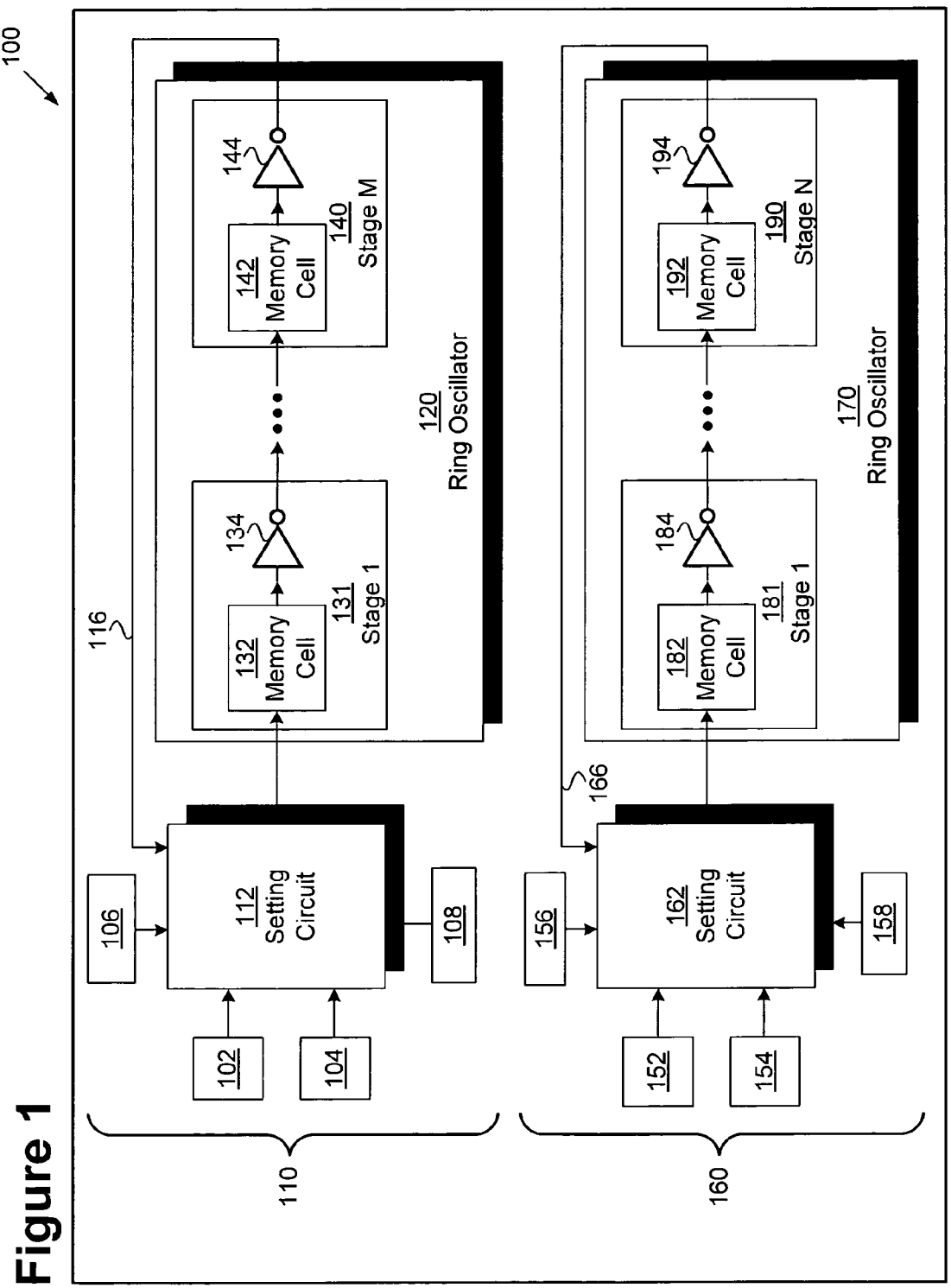
FIG. 1 illustrates a block diagram that includes a monitoring system that employs at least one performance monitor, according to one embodiment of the present invention.

The present invention is directed to a performance monitor including a memory ring oscillator. Although the present invention is described with respect to specific embodiments, the principles of the invention, as defined by the claims appended herein, can obviously be applied beyond the specifically described embodiments of the invention described herein. Moreover, in the description of the present invention, certain details have been left out in order not to obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals.

Adaptive voltage scaling systems may help manage speed and power in a semiconductor die, such as a silicon die. An adaptive voltage scaling system typically regulates a die's supply voltages based on operating characteristics like carrier mobility, actual operating temperature, and actual operating voltage. Conventionally, logic ring oscillators have been used to measure the gate delays of logic devices on a semiconductor die to estimate these operating parameters.

Unfortunately, conventional performance monitors have not accurately monitored the operating parameters of a semiconductor die with a significant number of memory cells. For instance, conventional performance monitors typically neglect memory devices, which can substantially influence operating characteristics. Moreover, a conventional performance monitor may not track the extent that the operating parameters of memory devices differ from the operating parameters of logic devices on the same die. Furthermore, a conventional performance monitor may not track the extent that the operating parameters of P type memory devices differ from the operating parameters than N type memory devices on the same die.

Disregarding the operating parameters of memory devices may deregulate the supply voltages of these devices and undermine speed or power optimization. Moreover, not monitoring the different operating parameters of P type memory devices and N type memory devices on the same die may allow a device's supply voltage to fall below the minimum permitted supply voltage. It may also unexpectedly turn off the device. It is therefore desirable to have a performance monitor that can accurately monitor the operating parameters of memory devices on a semiconductor die.

In view of these and other problems, FIG. 1 shows monitoring system 100 in accordance with one embodiment of the present invention. Monitoring system 100 may be integrated into a semiconductor die such as a silicon die. Monitoring system 100 may include at least one performance monitor, such as performance monitor 110 or performance monitor 160, integrated into the semiconductor die.

Performance monitor 110 may comprise at least one ring oscillator, such as ring oscillator 120, and setting circuit 112. Internally, ring oscillator 120 may include a plurality of stages, such as stage 131 (e.g., "Stage 1") through stage 140

(e.g., "Stage M," where M is typically an even integer). Stage 131 may comprise memory cell 132 and inverter 134. The output of inverter 134 may be coupled to the next stage (e.g., "Stage 2," not shown in FIG. 1) of ring oscillator 120.

Similarly, stage 140 may comprise memory cell 142 and inverter 144. Memory cell 142 may receive the output of the previous stage (e.g., "Stage M-1," also not shown in FIG. 1). The output of inverter 144 may be returned to setting circuit 112 as ring feedback signal 116. Setting circuit 112 may receive ring feedback signal 116, burn-in input 102, enable input 104, logical HIGH input 106, and logical LOW input 108. In this embodiment, memory cells 132 and 142 may be P type memory cells. Setting circuit 112 may be capable of setting an input signal of ring oscillator 120 to a reference voltage level.

Performance monitor 160 may comprise at least one ring oscillator, such as ring oscillator 170, and setting circuit 162. Internally, ring oscillator 170 may include a plurality of stages, such as stage 181 (e.g., "Stage 1") through stage 190 (e.g., "Stage N," where N is typically an even integer). Stage 181 may comprise memory cell 182 and inverter 184. The output of inverter 184 may be coupled to the next stage (e.g., "Stage 2," not shown in FIG. 1) of ring oscillator 170.

Similarly, stage 190 may comprise memory cell 192 and inverter 194. Memory cell 192 may receive the output of the previous stage (e.g., "Stage N-1," also not shown in FIG. 1). The output of inverter 194 may be returned to setting circuit 162 as ring feedback signal 166. Setting circuit 162 may receive ring feedback signal 166, burn-in input 152, enable input 154, logical HIGH input 156, and logical LOW input 158. In this embodiment, memory cells 182 and 192 may be N type memory cells. Setting circuit 162 may be capable of setting an input signal of ring oscillator 170 to a reference voltage level.

Figure 2:
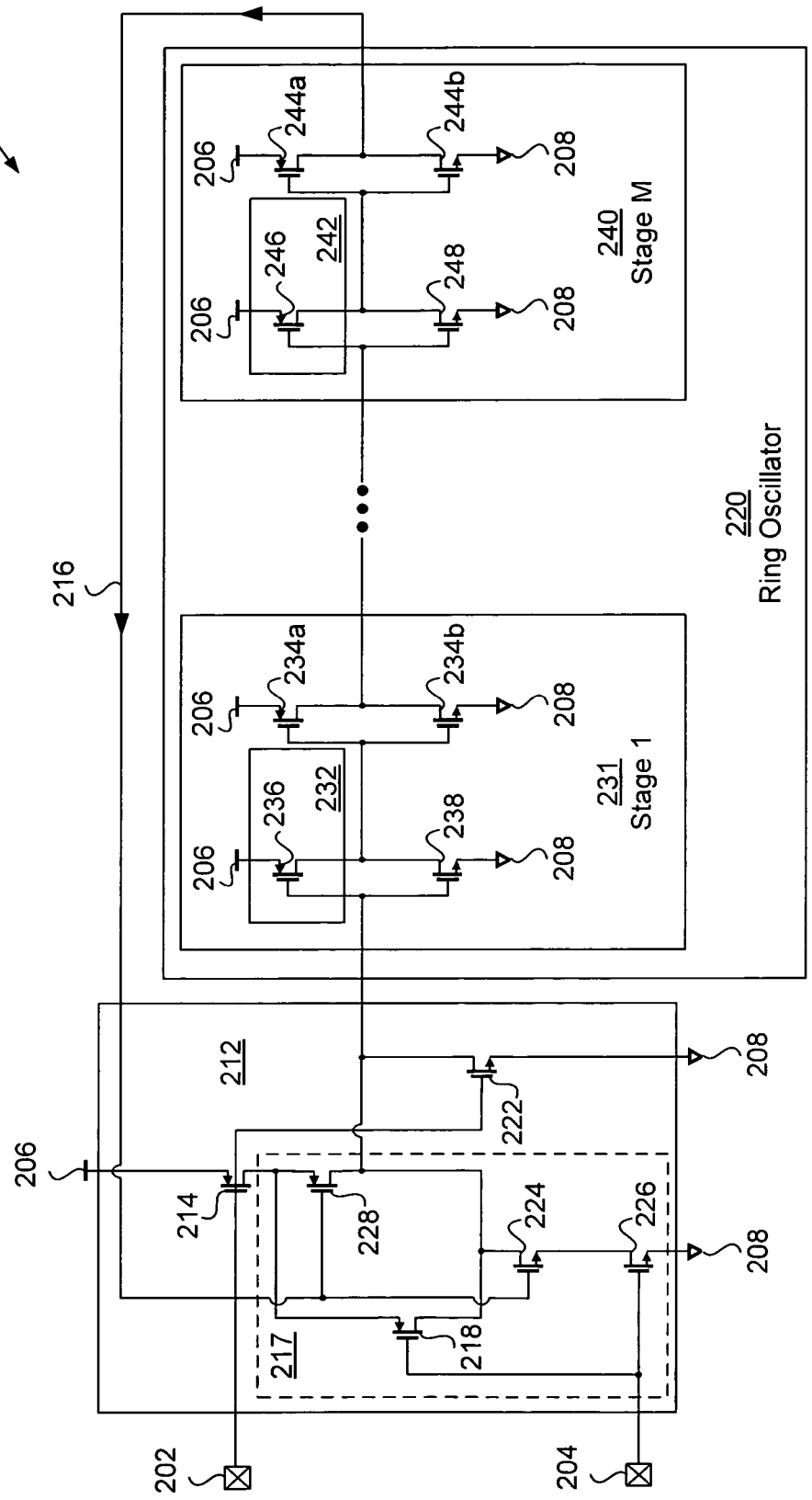
FIG. 2 shows, in more detail, a performance monitor with a memory ring oscillator, according to one embodiment of the present invention.

Referring to FIG. 2, performance monitor 210 in FIG. 2 may comprise ring oscillator 220 and setting circuit 212. Ring oscillator 220 may include stage 231 (e.g., "Stage 1") through stage 240 (e.g., "Stage M," where M is an even integer). Performance monitor 210 including ring oscillator 220 and setting circuit 212 corresponds to performance monitor 110 including ring oscillator 120 and setting circuit 112, in FIG. 1.

As shown in FIG. 2, stage 231 (e.g., "Stage 1") may include memory cell 232, which comprises P type metal-oxide-semiconductor (PMOS) memory device 236, and N type metal-oxide-semiconductor (NMOS) device 238. Stage 231 may also include an inverter configuration comprising PMOS device 234a and NMOS device 234b. Positive reference voltage 206 may be coupled to PMOS memory device 236 and PMOS device 234a, and ground terminal 208 may be coupled to NMOS devices 238 and 234b. The gate terminals of PMOS memory device 236 and NMOS device 238 may be coupled to setting circuit 212. The drain terminals of PMOS device 234a and NMOS device 234b may be coupled to the next stage (e.g., "Stage 2," not shown in FIG. 2) of ring oscillator 220.

Stage 240 (e.g., "Stage M") may include memory cell 242, which comprises PMOS memory device 246 and NMOS device 248. Stage 240 may include PMOS memory device 246 and NMOS device 248 and an inverter comprising PMOS device 244a and NMOS device 244b. Positive reference voltage 206 may be coupled to PMOS memory device 246 and PMOS device 244a, and ground terminal 208 may be coupled to NMOS devices 248 and 244b. The gate terminals of PMOS memory device 246 and NMOS device 248 may be coupled to the output of the previous stage (e.g., "Stage M-1," not shown in FIG. 2) of ring oscillator 220. Ring feedback signal 216 may be taken from the drain terminals of PMOS device 244a and NMOS device 244b and entered into an input of setting circuit 212.

Setting circuit 212 may receive ring feedback signal 216, burn-in input 202, enable input 204, and may be coupled to positive reference voltage 206 and ground terminal 208. Setting circuit 212 may comprise PMOS setting transistor 214 and NMOS setting transistor 222, each having a gate terminal connected to burn-in input 202. Within setting circuit 212, NAND gate 217 may comprise PMOS transistors 218 and 228, and NMOS transistors 224 and 226. NAND gate 217 may receive enable input 204 and ring feedback signal 216. Enable input 204 may be coupled to PMOS transistor 218 and NMOS transistor 226, while ring feedback signal 216 may be coupled to PMOS transistor 228 and NMOS transistor 224.

Figure 3:
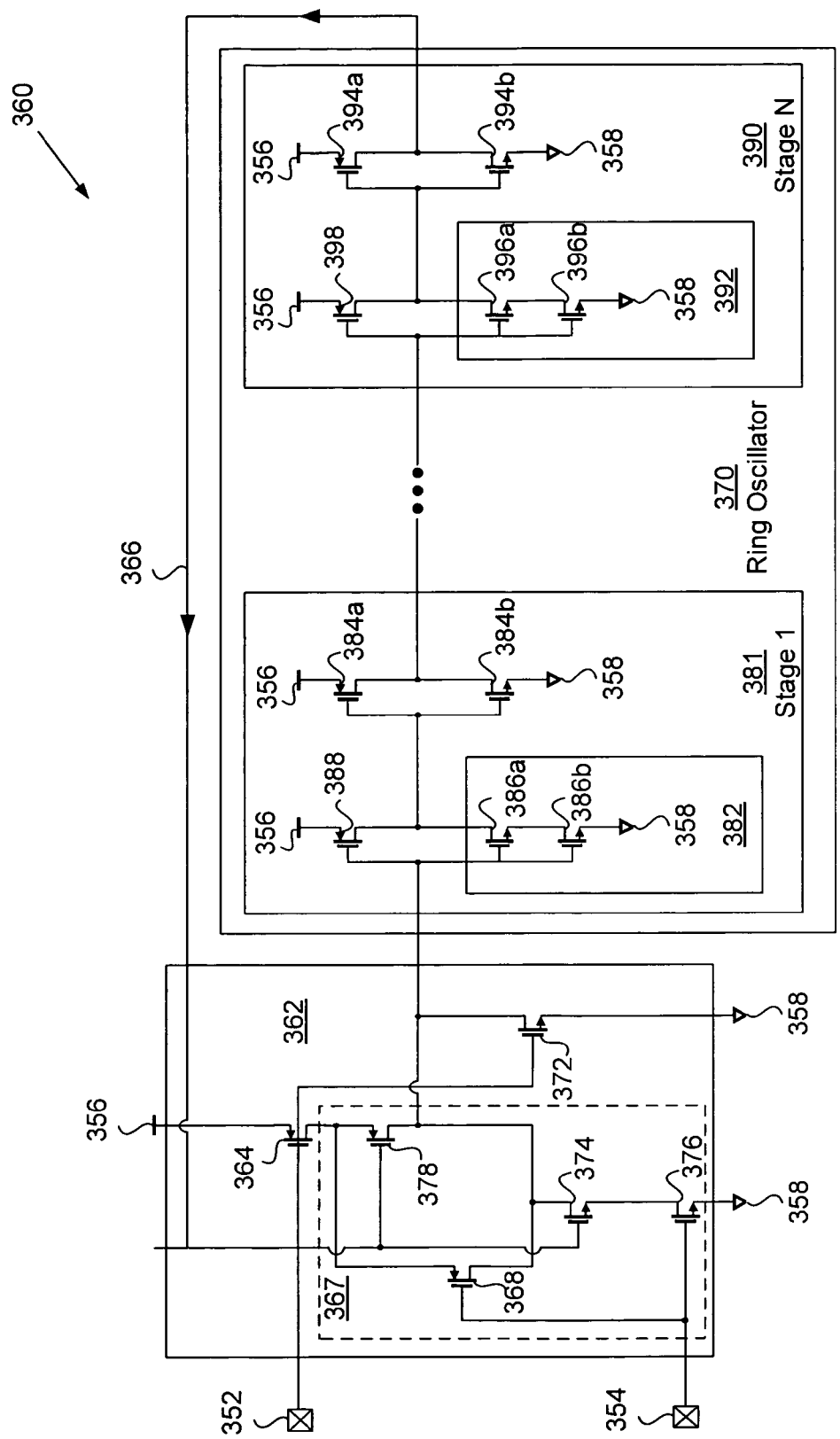
FIG. 3 shows, in more detail, another performance monitor with a memory ring oscillator, according to one embodiment of the present invention.

Referring to FIG. 3, performance monitor 360 in FIG. 3 may comprise ring oscillator 370 and setting circuit 362. Ring oscillator 370 may include stage 381 (e.g., "Stage 1") through stage 390 (e.g., "Stage N," where N is an even integer). It is noted that performance monitor 360 including ring oscillator 370 and setting circuit 362 corresponds to performance monitor 160 including ring oscillator 170 and setting circuit 162, in FIG. 1.

Stage 381 (e.g., "Stage 1") may include memory cell 382, which comprises NMOS memory devices 386a and 386b, and PMOS device 388. Stage 381 may further include an inverter comprising PMOS device 384a and NMOS device 384b. Positive reference voltage 356 may be coupled to PMOS devices 388 and 384a, while ground terminal 358 may be coupled to NMOS memory device 386b and NMOS device 384b. The gate terminals of PMOS device 388, NMOS memory device 386a, and NMOS memory device 386b may be coupled to setting circuit 362. The drain terminals of PMOS device 384a and NMOS device 384b may be coupled to the next stage (e.g., "Stage 2," not shown in FIG. 2) of ring oscillator 370.

Stage 390 (e.g., "Stage N") may include memory cell 392, which comprises NMOS memory devices 396a and 396b, and PMOS device 398. Stage 390 may further include an inverter comprising PMOS device 394a and NMOS device 394b. Positive reference voltage 356 may be coupled to PMOS devices 398 and 394a, while ground terminal 358 may be coupled to NMOS memory device 396b and NMOS device 394b. The gate terminals of PMOS device 398, NMOS memory device 396a, and NMOS memory device 396b may be coupled to the output of the previous stage (e.g., "Stage N-1," not shown in FIG. 2) of ring oscillator 370. The drain terminals of PMOS device 394a and NMOS device 394b may be returned to an input of setting circuit 362 as ring feedback signal 366.

Setting circuit 362 may receive ring feedback signal 366, burn-in input 352, enable input 354, and may be coupled to positive reference voltage 356 and ground terminal 358. Setting circuit 362 may comprise PMOS setting transistor 364 and NMOS setting transistor 372, each having a gate terminal coupled to burn-in input 352. Within setting circuit 362, NAND gate 367 may comprise PMOS transistors 368 and 378, and NMOS transistors 374 and 376. NAND gate 367 may receive enable input 354 and ring feedback signal 366. Enable input 354 may be coupled to PMOS transistor 368 and NMOS transistor 376, while ring feedback signal 366 may be coupled to PMOS transistor 378 and NMOS transistor 374.

The exemplary embodiments of FIGS. 1 through 3 will be further described by reference to flowchart 400 in FIG. 4. Flowchart 400 in FIG. 4 describes the steps, according to one embodiment of the present invention, of a method to adaptively scale an operating voltage of a memory device using a performance monitor with a memory ring oscillator. It is noted that certain details and features have been left out of flowchart 400 that are apparent to a person of ordinary skill in the art. For example, a step may comprise one or more sub-steps as known in the art. While steps 410 through 430 indicated in flowchart 400 are sufficient to describe one embodiment of the present invention, other embodiments of the invention may utilize steps different from those shown in flowchart 400.

Starting with step 410 of flowchart 400, and referring to FIGS. 1 through 3, step 410 comprises activating at least one ring oscillator including a plurality of stages, each stage comprising at least one memory device. With respect to monitoring system 100 in FIG. 1, activating ring oscillators 120 and 170 may comprise setting the inputs to these ring oscillator to a logical LOW value, a logical HIGH value, or allowing these ring oscillators to oscillate.

The setting circuits may be configured to set the input of the ring oscillator to a logical LOW value by supplying a logical HIGH value to the burn-in inputs. For example, burn-in input 102 may be set to a logical HIGH value to force the input of ring oscillator 120 to a logical LOW value. In the context of FIG. 2, connecting burn-in input 202 to a positive reference voltage may lower the input voltage of ring oscillator 220 and set the input to a logical LOW value. Similarly, burn-in input 152 in FIG. 1 may be set to a logical HIGH value to set the input of ring oscillator 170 in FIG. 1 to a logical LOW value. Thus, connecting burn-in input 352 in FIG. 3 to a positive reference voltage would lower the input voltage of ring oscillator 370 and set the ring oscillator input to a logical LOW value.

The setting circuits may also be configured to set the input of the ring oscillators to a logical HIGH value by supplying a logical LOW value to both the burn-in inputs and enable inputs. For instance, both burn-in input 102 and enable input 104 may be set to a logical LOW value to force the input of ring oscillator 120 to a logical HIGH value. In the context of FIG. 2, connecting burn-in input 202 and enable input 204 to a ground terminal would activate NAND gate 217 and set the input of logic ring oscillator 220 to a logical HIGH value. Similarly, both burn-in input 152 and enable input 154 in FIG. 1 may be set to a logical LOW value to set the input of ring oscillator 170 to a logical HIGH value. Thus, connecting burn-in input 352 and enable input 354 in FIG. 3 to a ground terminal would set the input of ring oscillator 370 to a logical HIGH value.

Moreover, activating the ring oscillator may comprise supplying a logical LOW value to the burn-in inputs and a logical HIGH value to the enable inputs to enable oscillation in the ring oscillator. For instance, allowing the ring oscillator inputs to oscillate may involve setting burn-in input 102 to a logical LOW value and enable input 104 to a logical HIGH value. Referring to FIG. 2, connecting burn-in input 202 to a ground terminal and enable input 204 to a positive reference voltage would activate NAND gate 217 and allow the input of ring oscillator 220 to oscillate according to the value of ring feedback signal 216. Similarly, setting burn-in input 152 in FIG. 1 to a logical LOW value and enable input 154 to a logical HIGH value may allow the input of ring oscillator 170 to oscillate. Thus, connecting burn-in input 352 in FIG. 3 to a ground terminal and connecting enable input 354 to a positive reference voltage would activate NAND gate 367 and allow the output of NAND gate 367 to oscillate according to the value of ring feedback signal 366.

Figure 4:
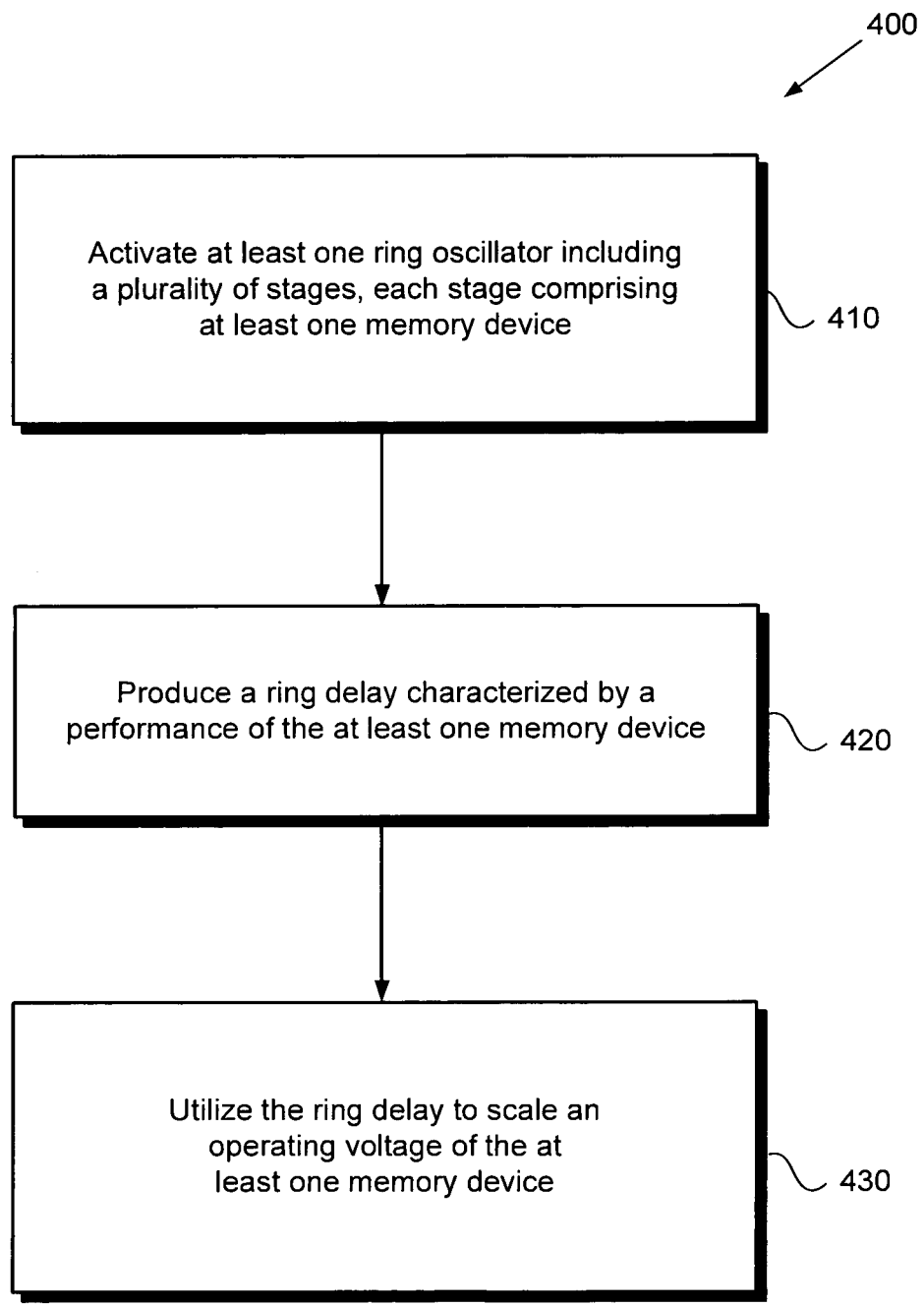
FIG. 4 describes the steps of a method to adaptively scale an operating voltage of a memory device using a performance monitor with a memory ring oscillator, according to one embodiment of the present invention.

Continuing to step 420 of flowchart 400 in FIG. 4 and referring to FIGS. 1 through 3, step 420 comprises producing a ring delay characterized by a performance of the at least one memory device. Referring to monitoring system 100 in FIG. 1, ring feedback signal 116 of ring oscillator 120 may include a ring delay that depends on P type memory cells, such as memory cells 132 through 142. Referring to FIG. 2, each of PMOS memory cells 232 through 242 may be characterized by a gate delay that depends on performance parameters like carrier mobility, actual operating temperature, and actual operating voltage. During normal operation of ring oscillator 220, sequential gate delays from PMOS memory cells 232 through 242 typically cascade through stages 231 (e.g., "Stage 1") through 240 (e.g., "Stage M"). Thus, the performance of PMOS memory cells 232 through 242 may characterize the ring delay in ring feedback signal 216.

Referring again to FIG. 1, ring feedback signal 166 of ring oscillator 170 may include another ring delay that depends on N type memory cells, such as memory cells 182 through 192. Referring to FIG. 3, each of NMOS memory devices 386*a*/386*b* through 396*a*/396*b* may be characterized by a gate delay that depends on performance parameters like carrier mobility, actual operating temperature, and actual operating voltage. During normal operation of ring oscillator 370, sequential gate delays from NMOS memory devices 386*a*/386*b* through 396*a*/396*b* typically cascade through stages 381 (e.g., "Stage 1") through 390 (e.g., "Stage N"). Consequently, the performance of NMOS memory devices 386*a*/386*b* through 396*a*/396*b* may characterize the ring delay in ring feedback signal 366.

Continuing to step 430 of flowchart 400 in FIG. 4 and referring to FIGS. 1 through 3, step 430 comprises utilizing the ring delay to scale an operating voltage of the at least one memory device. Referring to monitoring system 100 in FIG. 1, an embodiment of the present invention may scale the operating voltages of P type memory cells implemented on the die including performance monitor 110 according to the ring delay produced by ring oscillator 120. Analogously, an embodiment of the present invention may scale the operating voltages of N type memory cells implemented on the die including performance monitor 160 according to the ring delay produced by ring oscillator 170.

In one embodiment, scaling the operating voltage could comprise maintaining the operating voltage of a memory device to remain above the substantially lowest operating supply margin of a memory device. As is known in the art, the value of the lowest memory cell operating supply margin may be highly dependent upon the relative strengths of the P type and N type memory devices implemented on the die. Consequently, embodiments of the present invention may implement performance monitors 110 and 160 on the same die to enable scaling of the operating voltage so as to reduce the operating supply margins of the memory devices on the die to their substantially lowest levels, according to the ring delays produced by respective ring oscillators 120 and 170.

An embodiment of the present invention may effectively monitor the operating parameters of a semiconductor die with a significant number of memory cells. For example, embodiments of the present invention directly accommodate the role that the performance parameters of typically large memory cells play in the operating characteristics of a semiconductor die. Moreover, embodiments of the present invention accommodate and track the extent that the carrier mobilities and other operating characteristics of memory devices differ from the operating characteristics of logic devices on the same semiconductor die. Embodiments of the present invention also accommodate and track the different operating characteristics of P type memory devices and N type memory devices on the same semiconductor die.

As a result, embodiments of the present invention facilitate adaptive voltage scaling. Embodiments of the present invention therefore allow a semiconductor die with significant numbers of memory devices to be optimally regulated for speed and power dissipation. Moreover, by monitoring the different operating characteristics of P type memory devices and N type memory devices, embodiments of the present invention ensure that the operating voltages of memory cells on a semiconductor die do not fall below the minimum permitted supply voltage of these devices.

From the above description, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A monitoring system comprising:
   a first performance monitor comprising
      a first ring oscillator including a first plurality of stages, each of said first plurality of stages comprising at least one first memory device; and
      a first setting circuit configured to receive a first ring feedback signal having a first ring delay characterized by a performance of said at least one first memory device, and set a first input signal of said first ring oscillator to a first reference voltage level based on said first ring feedback signal; and
   a second performance monitor comprising
      a second ring oscillator including a second plurality of stages, each of said second plurality of stages comprising at least one second memory device; and
      a second setting circuit configured to receive a second ring feedback signal having a second ring delay characterized by a performance of said at least one second memory device, and set a second input signal of said second ring oscillator to a second reference voltage level based on said second ring feedback signal.

2. The monitoring system of claim 1, wherein
   said first setting circuit includes a first burn-in input and a first enable input; and
   said second setting circuit includes a second burn-in input and a second enable input.

3. The monitoring system of claim 2, wherein
   said first setting circuit is configured to set said first reference voltage level based on said first ring feedback signal when said first burn-in input is connected to ground and said first enable input is a positive reference voltage; and
   said second setting circuit is configured to set said second reference voltage level based on said second ring feedback signal when said second burn-in input is connected to ground and said second enable input is a positive reference voltage.

4. The monitoring system of claim 1, wherein
   said at least one first memory device comprises a P type metal-oxide-semiconductor (PMOS) device.

5. The monitoring system of claim 1, wherein
   said at least one second memory device comprises an N type metal-oxide-semiconductor (NMOS) device.

6. The monitoring system of claim 1, wherein
   each stage of said first plurality of stages of said first ring oscillator comprises a first inverter coupled to said at least one first memory device; and
   each stage of said second plurality of stages of said second ring oscillator comprises a second inverter coupled to said at least one second memory device.

7. The monitoring system of claim 1, wherein
   said first ring delay is utilized to scale a first operating voltage of said at least one first memory device; and
   said second ring delay is utilized to scale a second operating voltage of said at least one second memory device.

8. The monitoring system of claim 7, wherein
   said first operating voltage corresponds to an operating supply margin of said at least one first memory device; and
   said second operating voltage corresponds to an operating supply margin of said at least one second memory device.

9. The monitoring system of claim 1, wherein
   said first ring oscillator includes a P type metal-oxide-semiconductor (PMOS) memory device, and
   said second ring oscillator includes an N type metal-oxide-semiconductor (NMOS) memory device.

10. A monitoring system including at least one performance monitor integrated into a semiconductor die, said performance monitor comprising:
    at least one ring oscillator including a plurality of stages, each stage comprising at least one memory device; and
    a setting circuit configured to
       receive a ring feedback signal having a ring delay characterized by a performance of said at least one memory device; and
       set an input signal of said at least one ring oscillator to a reference voltage level based on said ring feedback signal, wherein
    said at least one ring oscillator includes a P type metal-oxide-semiconductor (PMOS) memory device, said monitoring system further comprising a second performance monitor including a second ring oscillator including an N type metal-oxide-semiconductor (NMOS) memory device, and
    said second performance monitor includes a second setting circuit including a second burn-in input and a second enable input, said setting circuit configured to
       receive a second ring feedback signal having a second ring delay characterized by a performance of the NMOS memory device; and
       set a second input signal of said second ring oscillator to a second reference voltage level based on said second ring feedback signal.

11. The performance monitor of claim 10, wherein said second setting circuit is configured to set said reference voltage based on said second ring feedback signal when said second burn-in input is connected to ground and said second enable input is a positive reference voltage.

12. An electronic device comprising:
    a first ring oscillator including a first plurality of stages, each of said first plurality of stages comprising at least one P type-metal-oxide-semiconductor (PMOS) memory device;
    first circuitry configured to
       receive a first ring feedback signal having a first ring delay based on a performance of said at least one at least one PMOS memory device; and set a first input signal of said first ring oscillator to a first reference voltage level based on said first ring feedback signal;

second ring oscillator including a second plurality of stages, each of said second plurality of stages comprising at least one N type-metal-oxide-semiconductor (NMOS) memory device; and second circuitry configured to
receive a second ring feedback signal having a second ring delay based on a performance of said at least one NMOS memory device; and
set a second input signal of said second ring oscillator to a second reference voltage level based on said second ring feedback signal.

13. The electronic device of claim 12, wherein said first ring oscillator, said circuitry, said second ring oscillator and said second circuitry are integrated into a semiconductor die.

14. The electronic device of claim 12, wherein
each stage of said first plurality of stages of said first ring oscillator comprises a first inverter coupled to said at least one PMOS memory device; and
each stage of said second plurality of stages of said second ring oscillator comprises a second inverter coupled to said at least one NMOS memory device.

15. The electronic device of claim 12, wherein
said first ring delay is utilized to scale a first operating voltage of said at least one PMOS memory device; and
said second ring delay is utilized to scale a second operating voltage of said at least one NMOS memory device.

16. The electronic device of claim 15, wherein
said first operating voltage corresponds to an operating supply margin of said at least one PMOS memory device; and
said second operating voltage corresponds to an operating supply margin of said at least one NMOS memory device.

17. The electronic device of claim 12, wherein
said first circuitry includes a first burn-in input and a first enable input; and
said second circuitry includes a second burn-in input and a second enable input.

18. The electronic device of claim 17, wherein
said first circuitry is configured to set said first reference to voltage to a logical LOW value when said first burn-in input is a logical HIGH value, and
said second circuitry is configured to set said second reference voltage to a logical LOW value when said second burn-in input is a logical HIGH value.

19. The electronic device of claim 17, wherein
said first circuitry is configured to set said first reference voltage to a logical HIGH value when said first burn-in input is a logical LOW value and said first enable input is a logical LOW value, and
said second circuitry is configured to set said second reference voltage to a logical HIGH value when said second burn-in input is a logical LOW value and said second enable input is a logical LOW value.

20. The electronic device of claim 17, wherein
said first circuitry includes a first PMOS transistor and a first NMOS transistor each having a gate connected to said first burn-in input; and
said second circuitry includes a second PMOS transistor and a second NMOS transistor each having a gate connected to said second burn-in input.

* * * * *